(12) United States Patent
Kronholz et al.

(10) Patent No.: US 8,357,573 B2
(45) Date of Patent: Jan. 22, 2013

(54) STRAIN ENHANCEMENT IN TRANSISTORS COMPRISING AN EMBEDDED STRAIN-INDUCING SEMICONDUCTOR ALLOY BY CREATING A PATTERNING NON-UNIFORMITY AT THE BOTTOM OF THE GATE ELECTRODE

(75) Inventors: Stephan Kronholz, Dresden (DE); Markus Lenski, Dresden (DE); Vassilios Papageorgiou, Austin, TX (US)

(73) Assignee: GLOBALFOUNDRIES, Inc., Grand Cayamn (KY)

( * ) Notice: Subject to any disclaimer, the term of this patent is extended or adjusted under 35 U.S.C. 154(b) by 227 days.

(21) Appl. No.: 12/772,436

(22) Filed: May 3, 2010

(65) Prior Publication Data
US 2010/0301421 A1 Dec. 2, 2010

(30) Foreign Application Priority Data
May 29, 2009 (DE) .......................... 10 2009 023 298

(51) Int. Cl.
*H01L 21/8238* (2006.01)
*H01L 21/336* (2006.01)

(52) U.S. Cl. ........ 438/199; 257/327; 257/347; 257/369; 257/E27.062; 257/E21.409; 438/230; 438/285; 438/279; 438/303

(58) Field of Classification Search .................. 257/288, 257/401, 901; 438/292–308
See application file for complete search history.

(56) References Cited

U.S. PATENT DOCUMENTS

| 2006/0091482 | A1 | 5/2006 | Kim et al. ...................... 257/401 |
| 2007/0210354 | A1* | 9/2007 | Nabatame et al. ............ 257/288 |
| 2007/0252204 | A1* | 11/2007 | Wei et al. ...................... 257/347 |
| 2008/0048270 | A1* | 2/2008 | Adetutu et al. ............... 257/368 |
| 2008/0277726 | A1* | 11/2008 | Doris et al. .................... 257/351 |
| 2012/0018810 | A1* | 1/2012 | Chambers et al. ........... 257/369 |

FOREIGN PATENT DOCUMENTS
DE 102007030053 A1 1/2009

OTHER PUBLICATIONS

Translation of Official Communication from German Patent Office for German Patent Application No. 10 2009 023 298.2 dated Nov. 9, 2010.

* cited by examiner

*Primary Examiner* — Mamadou Diallo
(74) *Attorney, Agent, or Firm* — Williams, Morgan & Amerson, P.C.

(57) ABSTRACT

Performance of P-channel transistors may be enhanced on the basis of an embedded strain-inducing semiconductor alloy by forming a gate electrode structure on the basis of a high-k dielectric material in combination with a metal-containing cap layer in order to obtain an undercut configuration of the gate electrode structure. Consequently, the strain-inducing semiconductor alloy may be formed on the basis of a sidewall spacer of minimum thickness in order to position the strain-inducing semiconductor material closer to a central area of the channel region.

15 Claims, 6 Drawing Sheets

STRAIN ENHANCEMENT IN TRANSISTORS COMPRISING AN EMBEDDED STRAIN-INDUCING SEMICONDUCTOR ALLOY BY CREATING A PATTERNING NON-UNIFORMITY AT THE BOTTOM OF THE GATE ELECTRODE

BACKGROUND OF THE INVENTION

1. Field of the Invention

Generally, the present disclosure relates to the fabrication of highly sophisticated integrated circuits including advanced transistor elements that comprise strain-inducing semiconductor alloys.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity which in turn causes an increase of gate resistivity due to the reduced dimensions, is a dominant design criterion for accomplishing an increase in the operating speed of the integrated circuits.

Presently, the vast majority of integrated circuits is based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 80 nm may require a gate dielectric made of silicon dioxide as thin as approximately 1.2 nm. Although usage of high speed transistor elements having an extremely short channel may be restricted to high speed signal paths, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance driven circuits, even if transistors in speed critical paths are formed on the basis of an extremely thin gate oxide.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer.

In addition to providing sophisticated gate electrode structures by using high-k dielectric materials and metal-containing gate electrode materials, other approaches have been developed in order to enhance transistor performance for a given gate length and a thickness of a gate dielectric material. For example, by creating a certain strain component in the channel region of the transistor elements, the charge-carrier mobility, and thus the overall conductivity of the channel, may be enhanced. For a silicon material having a standard crystallographic configuration, i.e., a (100) surface orientation with the channel length direction oriented along a <110> equivalent direction, the creation of a tensile strain component in the current flow direction may enhance conductivity of electrons, thereby improving transistor performance of N-channel transistors. On the other hand, generating a compressive strain component in the current flow direction may increase hole mobility and thus provide superior conductivity in P-channel transistors. Consequently, a plurality of strain-inducing mechanisms have been developed in the past which may per se require a complex manufacturing sequence for implementing the various strain-inducing techniques. For example, one promising approach that is frequently applied is the incorporation of a compressive strain-inducing silicon/germanium alloy in the drain and source areas of P-channel transistors. For this purpose, in an early manufacturing stage, cavities are formed selectively adjacent to the gate electrode structure of the P-channel transistor, while the N-channel transistors are covered by a spacer layer. Additionally, the gate electrode of the P-channel transistor has to be encapsulated in order to not unduly expose the gate electrode material to the etch ambient for forming the cavities and also for providing an efficient growth mask during the selective epitaxial growth process, in which the silicon/germanium alloy may be grown on a crystalline substrate material, while a significant deposition of the alloy on dielectric surface areas may be suppressed by appropriately selecting the corresponding process parameters. After forming the strain-inducing silicon/germanium alloy, the corresponding spacer structure and a cap layer encapsulating the gate electrode of the P-channel transistor may be removed along with the spacer layer that covers the N-channel transistors. Thereafter, the further processing may be continued by forming drain and source regions so as to complete the basic transistor configuration.

A strain-inducing mechanism as described above is a very efficient concept for improving the transistor performance, at least for P-channel transistors, since, for a given gate length, an increased current drive capability may be accomplished. The finally obtained strain component in the channel region significantly depends on the internal strain level of the silicon/germanium material, which in turn depends on the lattice mismatch between the silicon/germanium alloy, i.e., its natural lattice constant, and the remaining template material of the silicon-based active region. Frequently, a desired increase of the germanium concentration in view of accordingly increasing the lattice mismatch may be associated with significant technological problems in view of germanium agglomeration and the creation of significant lattice irregularities so that germanium concentration levels of above 30 atomic percent are difficult to achieve on the basis of presently available selective epitaxial growth techniques. In addition to the germanium concentration, the effective offset of the strained silicon/germanium alloy from the channel region strongly influences the strain level in the channel region. Consequently, it is attempted to reduce the lateral offset of a corresponding cavity and thus of the resulting silicon/germanium alloy with respect to the channel region by reducing a width of spacer elements, which are typically used as mask material during the above-described process sequence for forming the silicon/germanium alloy. Although the reduction of the lateral offset may represent an efficient mechanism for adjusting a desired high strain level, upon further reducing the overall device dimensions, the width of the corresponding spacer elements may not be arbitrarily reduced in order to preserve integrity of the gate electrode structure during the patterning process, the deposition process and corresponding cleaning processes that may typically have to be performed in order to prepare the exposed surface areas for the selective epitaxial growth process. Consequently, in very sophisticated semiconductor devices, a minimum width of the corresponding spacer elements may be in the range of 8-10 nm, wherein a further reduction of the spacer width may be associated with a high probability of creating a pronounced yield loss due to defects in the gate electrode structure. Thus, this per se very efficient mechanism may suffer from scalability since, upon further reducing the gate length of sophisticated transistor elements, the lateral offset may not be scaled in a proportional manner since a minimum spacer width may be required in view of gate integrity.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which at least the scalability of a strain-inducing mechanism based on an embedded semiconductor alloy may be enhanced by patterning gate electrode structures on the basis of a given design gate length, wherein a bottom portion of the gate electrode may have a tapered portion or undercut portion which may enable the positioning of a strain-inducing semiconductor material with a reduced offset from the effective channel region on the basis of a given minimum desired width or thickness of a protective sidewall spacer element. In some illustrative embodiments disclosed herein, it has surprisingly been recognized that the patterning of a gate electrode structure including a sophisticated material system including a high-k dielectric material in combination with an appropriate metal-containing cap material may result in a certain degree of undercutting of the bottom portion of the gate electrode structure, at least for one type of transistor, thereby providing the possibility of forming a highly conformal spacer element on the basis of a desired minimum width, for instance based on a spacer layer thickness of approximately 10 nm or less, which may result in enhanced scalability of the strain-inducing mechanism. In some illustrative embodiments disclosed herein, the patterning of a sophisticated gate layer stack may result in a corresponding undercut selectively in the gate electrode structures of P-channel transistors, the performance of which may be efficiently increased on the basis of strain-inducing semiconductor alloys, such as silicon/germanium, silicon/tin, silicon/germanium/tin and the like. Consequently, in some illustrative aspects disclosed herein, an efficient strain-inducing mechanism on the basis of an embedded strain-inducing semiconductor alloy may be efficiently combined with the provision of a superior gate electrode structure, which may comprise at least a high-k dielectric material in combination with a metal-containing cap layer.

One illustrative method disclosed herein comprises forming a gate electrode structure above a semiconductor region, wherein the gate electrode structure comprises a high-k dielectric material, a metal-containing cap layer formed above the high-k dielectric material, a semiconductor material formed above the metal-containing cap layer and a dielectric cap material formed above the semiconductor material.

Moreover, the gate electrode structure has a tapered bottom portion with a reduced length. The method further comprises forming a spacer on sidewalls of the gate electrode structure, wherein the spacer has a first spacer portion adhering to the tapered bottom portion and a second spacer portion adhering to a substantially non-tapered portion of the gate electrode structure. The method additionally comprises forming an embedded strain-inducing semiconductor material in the semiconductor region with a lateral offset that is determined by the first spacer portion. Additionally, the method comprises forming drain and source regions of a transistor in at least a portion of the semiconductor alloy.

A further illustrative method disclosed herein comprises forming a gate layer stack above a first semiconductor region and a second semiconductor region. The method further comprises patterning the gate layer stack so as to form a first gate electrode structure above the first semiconductor region and to form a second gate electrode structure above the second semiconductor region, wherein the second gate electrode structure has a greater effective gate length relative to the first gate electrode structure. Moreover, the method comprises forming a spacer layer above the first and second gate electrode structures with a thickness of approximately 10 nm or less. Additionally, the method comprises forming a spacer element on sidewalls of the first gate electrode structure on the basis of the spacer layer. Furthermore, the method comprises forming a strain-inducing semiconductor alloy in the first semiconductor region by using the spacer element as a mask.

One illustrative semiconductor device disclosed herein comprises a gate electrode structure of a transistor, which is formed above a semiconductor region and comprises an electrode material formed above a metal-containing cap material that is formed above a gate insulation layer comprising a high-k dielectric material. The gate electrode material has a bottom portion and a top portion of different lengths, wherein a length of the bottom portion is approximately 50 nm or less. The semiconductor device further comprises a strain-inducing semiconductor alloy formed in the semiconductor region. Additionally, the semiconductor device comprises drain and source regions that are at least partially formed in the strain-inducing semiconductor alloy.

BRIEF DESCRIPTION OF THE DRAWINGS

The disclosure may be understood by reference to the following description taken in conjunction with the accompanying drawings, in which like reference numerals identify like elements, and in which.

Figure 1A:
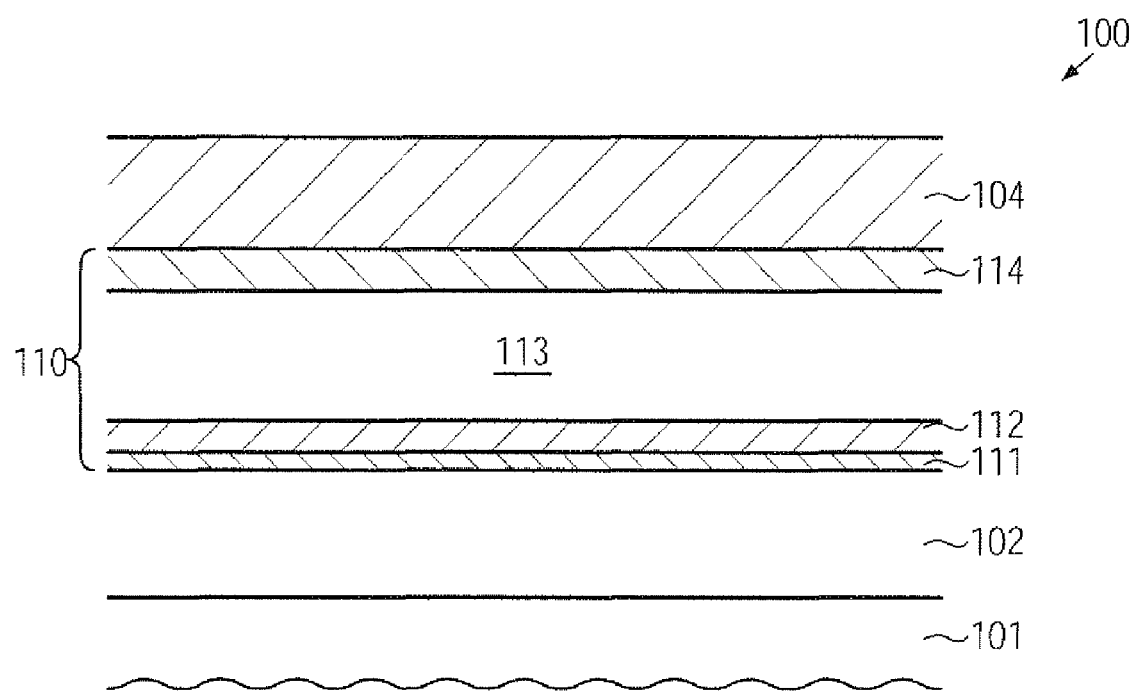
FIGS. 1a-1c schematically illustrate cross-sectional views of a semiconductor device during various manufacturing stages in forming a gate layer stack on the basis of a high-k dielectric material, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, according to the principles disclosed herein, the strain-inducing efficiency of an embedded semiconductor alloy may be enhanced by providing an undercut area of gate electrode structures that may be formed on the basis of a design gate length, thereby positioning the strain-inducing semiconductor alloy at least within an edge region of the effective channel region for a given required minimum thickness of a sidewall spacer element that may provide for the integrity of the gate electrode structure during the manufacturing sequence for forming the strain-inducing semiconductor alloy. Without intending to restrict the present application to the following explanation, it is believed that, during the patterning process, i.e., during respective anisotropic etch recipes in combination with additional cleaning recipes and the like, a sophisticated gate electrode stack including a high-k dielectric material in combination with a metal-containing cap material may result in a different etch behavior compared to "conventional" gate electrodes formed on the basis of polysilicon and a silicon oxide-based gate dielectric material. That is, it is believed that an increased horizontal etch component may occur at the final phase of the patterning process caused by the presence of the high-k dielectric material and the cap layer. Consequently, for a given design gate length, the patterning of the sophisticated gate layer stack may thus result in a somewhat reduced effective gate length so that, during the subsequent process sequence, the strain-inducing semiconductor alloy may be positioned at least in a corresponding transition area, thereby providing a superior strain mechanism. In other cases it has surprisingly been recognized that, during a patterning sequence designed to obtain a target gate length for P-channel transistors and N-channel transistors, may result in an asymmetric configuration of the resulting gate electrode structures as the gate electrode structure of the P-channel transistor may have an undercut area, while the gate electrode structure of the N-channel transistor may exhibit a substantially constant gate length or may even have an increased length at the foot of the gate electrode structure. It is believed that corresponding asymmetric behavior may result from or may be increased by the presence of a threshold adjusting semiconductor alloy below the gate electrode structure of the P-channel transistor. In this case, this patterning behavior may be efficiently taken advantage of in providing a superior strain-inducing mechanism on the basis of silicon/germanium and the like, while nevertheless obtaining a desired average design gate length for both types of transistors.

FIG. 1a schematically illustrates a cross-sectional view of a semiconductor device 100 comprising a substrate 101 above which may be formed a semiconductor layer 102 that may be provided in the form of a silicon-based crystalline semiconductor material, the electronic characteristics of which may be adapted on the basis of a certain strain component, as discussed above. The substrate 101 may represent any appropriate carrier material, such as a semiconductor material, an insulating material and the like. Furthermore, in some cases, the substrate 101 and the semiconductor layer 102 may represent an SOI (silicon-on-insulator) configuration when a buried insulating material (not shown) may be formed between the substrate 101 and the semiconductor layer 102. A corresponding SOI configuration may not necessarily be provided across the entire device 100 but may be locally restricted to certain device areas, if considered appropriate. Moreover, in the manufacturing stage shown, the device 100 may comprise any appropriate isolation structures, such as shallow trench isolations (not shown) in order to laterally delineate active regions, as will be described later on with reference to FIGS. 2a-2b. Consequently, in the embodiment shown, the semiconductor layer 102, i.e., the portion illustrated in FIG. 1a, may represent a silicon-based semiconductor region in and above which a transistor element is to be formed. Moreover, a gate layer stack 110 may be formed on the semiconductor layer 102 and may comprise a gate dielectric layer 111, a metal-containing cap layer 112, a semiconductor material 113 and a dielectric cap material 114. As previously explained, the gate dielectric layer 111 may comprise a high-k dielectric material, such as hafnium oxide, hafnium silicon oxide, zirconium oxide and the like, which may be understood as dielectric materials having a dielectric constant of 10.0 and higher. The high-k dielectric material may be provided in combination with a "conventional" dielectric material, such as a silicon dioxide-based material layer having a reduced thickness of less than 1 nm, if the superior interface characteristics of a silicon dioxide-based material with the semiconductor layer 102 are considered appropriate. As discussed above, high-k dielectric materials may exhibit a pronounced oxygen affinity, which may result in a significant alteration of material characteristics and in particular of the dielectric constant, which may be considered inappropriate in view of threshold variability of the resulting transistor element. For this reason, the cap layer 112 may be provided on the gate dielectric layer 111, wherein, in view of superior electrical performance, the material 112 may have a certain degree of conductivity while also providing the possibility of appropriately adjusting a work function of the resulting gate electrode structure. For example, titanium nitride may act as an efficient cap material and may also enable an appropriate adjustment of the work function, possibly in combination with a specific threshold adjusting semiconductor material provided in the semiconductor layer 102, as will be described later on. The semiconductor material 113 may be provided in the form of an amorphous silicon material, a polysilicon material and the like, wherein the material 113 may act as the actual electrode material, while, in other cases, the layer 113 may be replaced in an advanced manufacturing stage when a superior gate conductivity is required by providing a metal-containing electrode material. Furthermore, the layer stack may comprise the dielectric cap material 114, for instance in the form of a silicon nitride material and the like, which may be used as a mask during the further processing in forming a strain-inducing semiconductor alloy. Moreover, a mask layer 104 may be provided above the gate layer stack 110 and may comprise any appropriate materials, such as hard mask materials, anti-reflective coating (ARC) materials, in combination with resist materials and the like.

The semiconductor device 100 as illustrated in FIG. 1a may be formed on the basis of well-established process techniques, such as forming isolation structures, forming the gate dielectric material 111 based on oxidation and deposition processes followed by the deposition of the cap material 112 in order to reliably confine the high-k component of the gate dielectric layer 111. The semiconductor material 113 may be formed on the basis of any appropriate deposition technique, such as low pressure chemical vapor deposition (CVD) and the like. Thereafter, the cap material 114 may be formed, for instance by plasma enhanced CVD, thermally activated CVD and the like. Thereafter, the mask material 114 may be provided by CVD, spin-on techniques and the like.

Figure 1B:
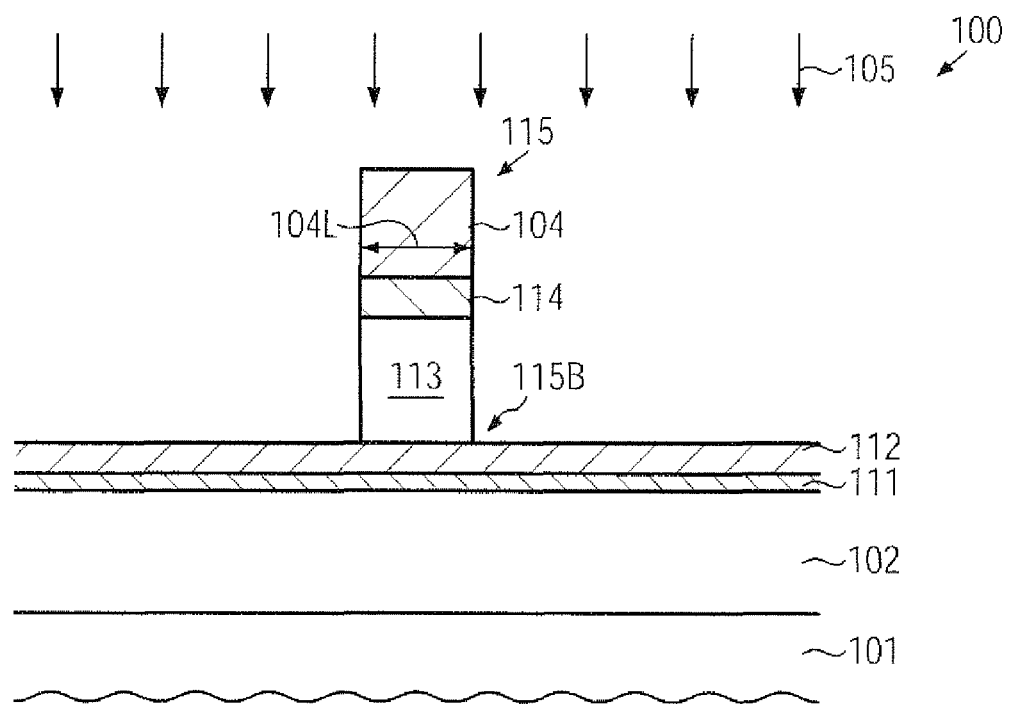

FIG. 1b schematically illustrates the semiconductor device 100 in a further advanced manufacturing stage. As illustrated, a gate electrode structure 115 may be provided in an intermediate state in which cap material 114 and the semiconductor material 113 may be patterned on the basis of the mask material 104 in a reactive process ambient 105. To this end, the mask material 104 may be patterned in accordance with sophisticated lithography and etch techniques, if a hard mask material is to be provided, so as to obtain a desired target gate length for the mask material 104, as indicated by 104L. Thereafter, the etch ambient 105 may be established by using appropriate plasma assisted etch recipes, for instance based on hydrogen bromide, chlorine-based chemistries and the like, in order to etch through the cap layer 114 and remove the material of the layer 113 selectively with respect to the cap layer 112. For this purpose, similar process strategies may be applied, as may also be used in conventional gate electrode structures based on polysilicon material and a silicon dioxide-based dielectric material. Due to the presence of the cap material 112, in combination with the dielectric material 111, which may comprise a high-k dielectric material, a different etch behavior at a bottom portion 115B of the gate electrode structure 115 may be obtained compared to conventional polysilicon/silicon dioxide-based electrode structures due to a different material composition and the different thickness of the layers 111 and 112 compared to extremely thin conventional silicon oxide-based gate dielectrics.

Figure 1C:
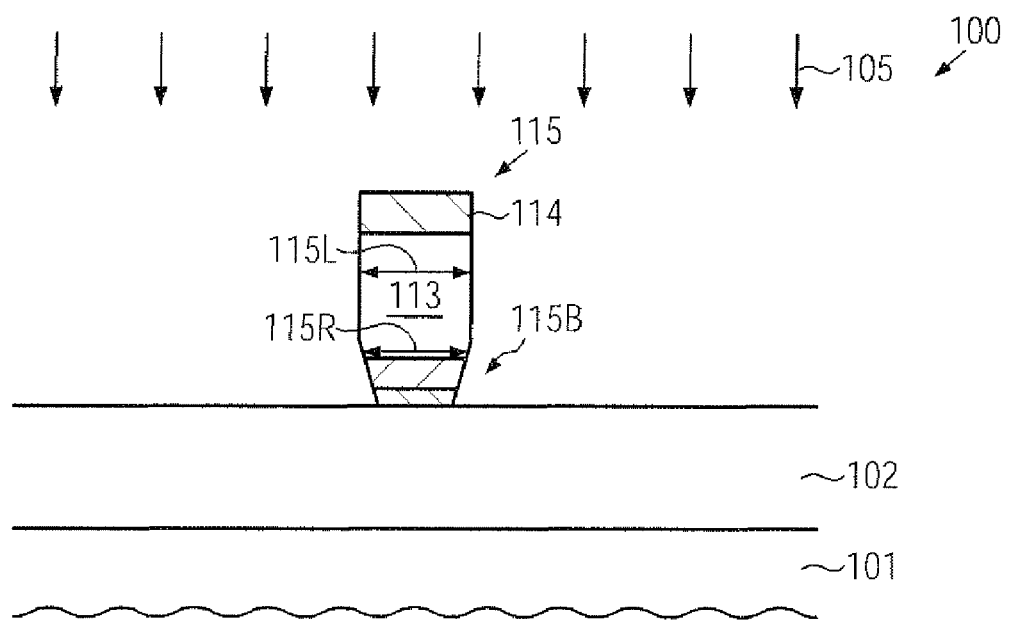

FIG. 1c schematically illustrates the semiconductor device 100 in an advanced phase of exposing the device 100 to the reactive process ambient 105. For example, the process ambient 105 may be performed on the basis of an etch chemistry for etching through the layers 112 and 111 (FIG. 1b) with a subsequent appropriate cleaning process in order to remove any residues of the mask material and also remove any contaminants, particles and the like. After completing the patterning of the gate electrode structure 115 in the reactive process ambient 105, the bottom portion 115B may have a tapered or undercut configuration, wherein a length 115R of the bottom portion 115B may, therefore, be less compared to a length 115L of a substantially non-tapered portion of the gate electrode structure 115. It should be appreciated that the length 115R may refer to an average length of the semiconductor material 113 in the bottom portion 115B at an interface connecting to the metal-containing cap layer 112 or any extremely thin interface layer, while the length 115L may refer to the length of the material 113 in an upper portion thereof, in which the length 115L may substantially correspond to the target gate length of the device 100, since substantially vertical sidewalls may typically be formed along the major part of the material 113 in accordance with well-established process recipes. It should further be appreciated that an average length is referred to since typically a certain degree of length variability may occur along a transistor width direction, i.e., in FIG. 1c, the direction perpendicular to the drawing plane, which may be caused by the grain size of the material 113 when provided in the form of a polysilicon material and the like.

Figure 1D:
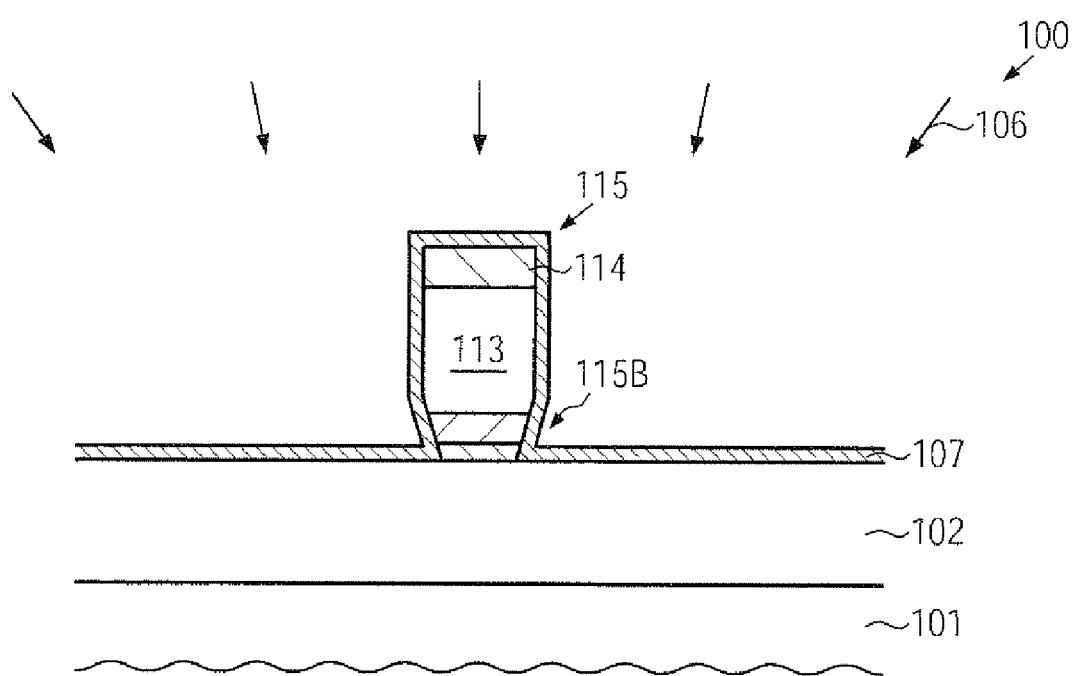
FIGS. 1d-1f schematically illustrate cross-sectional views of the semiconductor device in further advanced manufacturing stages when an embedded strain-inducing semiconductor alloy is formed on the basis of sidewall spacers and an undercut configuration of the gate electrode structure, according to illustrative embodiments.

FIG. 1d schematically illustrates the semiconductor device 100 during a deposition process 106, for instance a plasma enhanced deposition process, a thermally activated deposition process and the like, in order to form a spacer layer 107, for instance a silicon nitride material, possibly in combination with an etch stop liner (not shown) in order to encapsulate the gate electrode structure 115. Since the spacer layer 107 may be used to form sidewall spacer elements for the gate electrode structure 115, a reduced thickness is highly desirable, as explained above, while nevertheless integrity of the gate electrode structure 115 is to be preserved during the further processing. Consequently, a minimum required thickness may be determined in advance for the layer 107 so as to meet the requirements with respect to gate integrity for a given material composition of the spacer layer 107. For example, based on thermally activated deposition recipes, a silicon nitride material may be formed with a thickness of approximately 10 nm or less, such as 8 nm and less, or even with 5 nm and less, while in other cases an even more reduced thickness may be selected, for instance by using plasma enhanced CVD techniques, which may provide superior density of silicon nitride material, thereby increasing the overall etch resistivity during the further processing. It should be appreciated that an appropriate minimum thickness may be readily determined by performing appropriate experiments. Moreover, the layer 107 may be deposited in a very conformal manner so that the layer 107 may adhere to the bottom portion 115B, thereby also resulting in an undercut or tapered configuration. After the deposition of the spacer layer 107, an anisotropic etch process may be performed in order to remove the material of the spacer layer 107 from above the semiconductor layer 102.

Figure 1E:
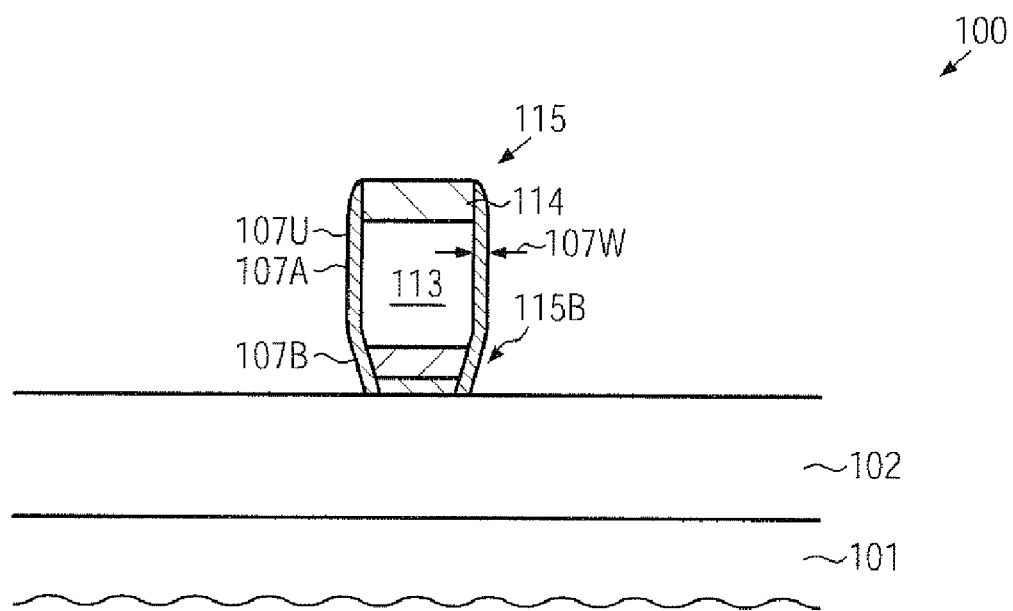

FIG. 1e schematically illustrates the semiconductor device 100 with resulting spacer elements 107A with a width 107W that is determined by the initial thickness of the layer 107 of FIG. 1d and the characteristics of the etch process performed to remove an unwanted portion of the spacer layer. Typically, the resulting width may be reduced compared to the initial thickness of the spacer layer 107, which may, however, be readily taken into consideration when selecting an appropriate initial thickness. It should further be appreciated that the material of the layer 107 may also be efficiently removed within the undercut portion 115B so that a width of a bottom portion 107B of the spacer 107A may substantially correspond to the width 107W of an upper portion 107U. Consequently, the spacer 107A may also resemble the undercut configuration of the portion 115B.

Figure 1F:
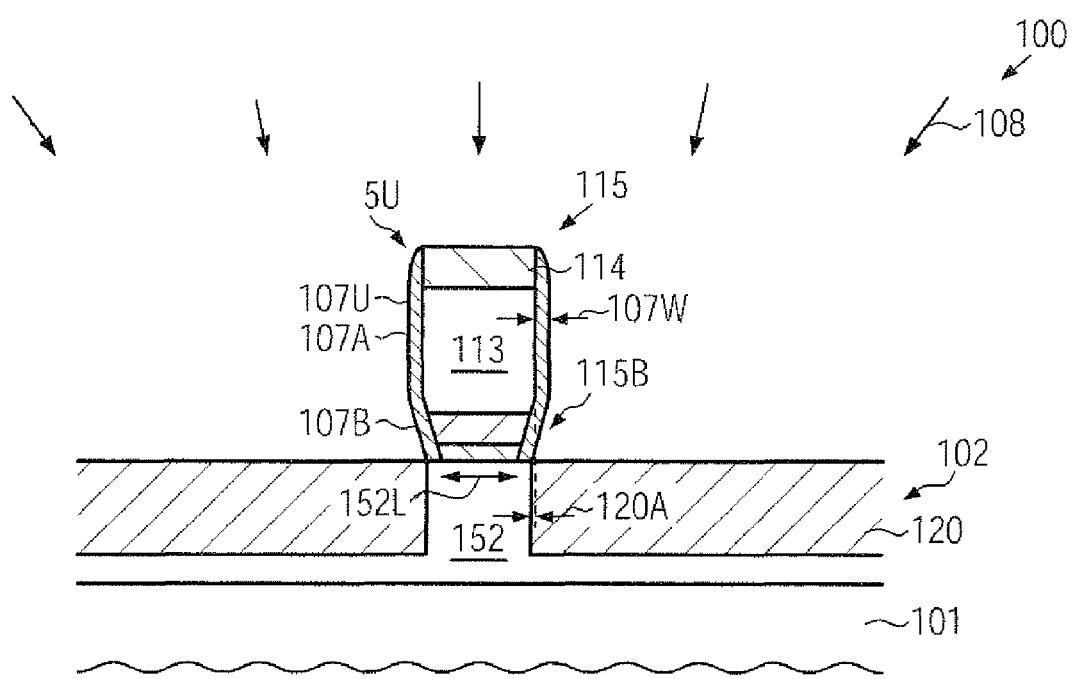

FIG. 1f schematically illustrates the semiconductor device 100 during a process sequence 108, in which a strain-inducing semiconductor alloy 120 may be formed in the semiconductor layer 102. As previously discussed, the process sequence 108 may comprise an etch process for forming cavities in the semiconductor layer 102, wherein a lateral offset of the corresponding cavities may be substantially determined by the width of the spacer 107A, the characteristics of the etch process and the configuration of the gate electrode structure 115. In this respect, the lateral offset may be considered as an offset 120A of the material 120 from the semiconductor material 113 at the upper portion 115U, which may thus represent a non-tapered portion, as previously explained. It should be appreciated that, compared to the design length 115L (FIG. 1c), the semiconductor alloy 120 may be positioned closer to a channel region 152, wherein an effective channel length 152L may also be reduced due to the undercut configuration of the lower portion 115B. Thus, in total, a lateral distance between the semiconductor alloys 120 at both sides of the gate electrode structure 115 may also be reduced, thereby generally enhancing the strain-inducing effect. Furthermore, although the effective channel length 152L may be reduced, nevertheless, the electrode material above the tapered portion 115B may also have an influence on the channel controllability such that the material 120 may be positioned at a peripheral channel region, which may thus provide superior charge carrier mobility in this area, which may, therefore, also contribute to enhanced transistor performance, even though the offset of the material 120 from the effective channel region 152 may nevertheless be determined by the width 107W of the spacer 107A.

The semiconductor device 100 as illustrated in FIG. 1f may thus be formed on the basis of well-established process techniques, while at the same time increasing the efficiency of the resulting transistor performance for otherwise the same conditions compared to a conventional semiconductor device. During a corresponding epitaxial growth process for forming the strain-inducing semiconductor material 120, any appropriate material composition, such as silicon/germanium, silicon/tin, silicon/germanium/tin, may be provided in order to create a compressive strain component.

Figure 1G:
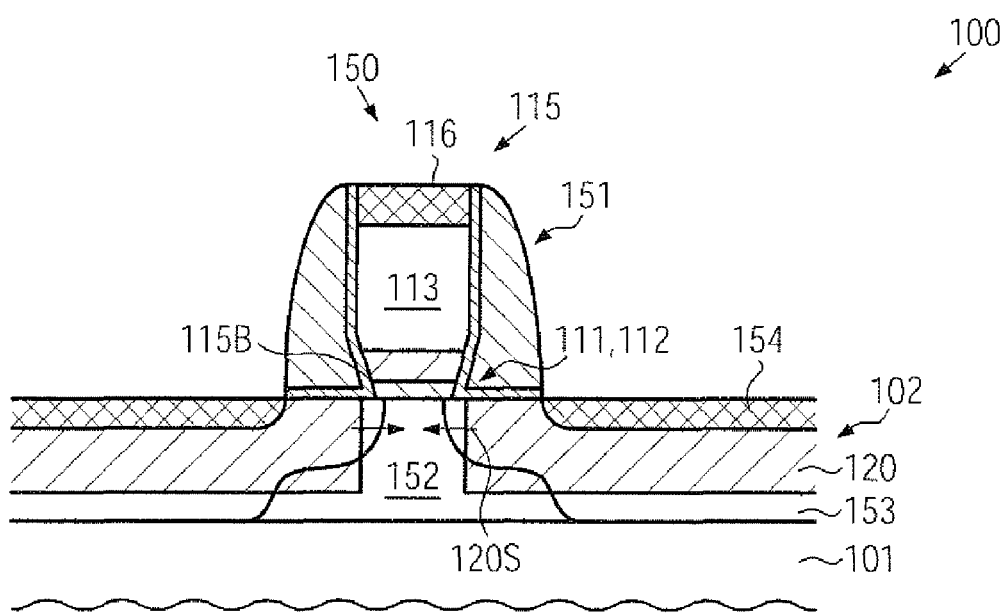
FIGS. 1g-1h schematically illustrate cross-sectional views of transistors comprising gate electrode structures on the basis of a high-k dielectric material and a tapered or undercut portion so as to provide an efficient strain-inducing mechanism, according to illustrative embodiments.

FIG. 1g schematically illustrates the semiconductor device 100 in a further advanced manufacturing stage. As illustrated, a transistor 150 may be formed in and above the semiconductor layer 102 and may comprise the gate electrode structure 115, which in the present embodiment may comprise the layers 111 and 112, i.e., the gate dielectric material in combination with the metal-containing cap layer, followed by at least a portion of the semiconductor material 113. Furthermore, a metal silicide region 116 may be formed in a portion of the material 113. Moreover, a sidewall spacer structure 151 may be formed on sidewalls of the gate electrode structure 115. Furthermore, drain and source regions 153 may be formed, at least partially, within the strain-inducing semiconductor alloy 120 and may also comprise metal silicide regions 154 in order to reduce overall contact resistivity. Consequently, the material 120 may provide a desired strain component 120S in the channel region 152, thereby enhancing performance of the transistor 150, which may represent a P-channel transistor when the strain component 120S represents a compressive strain.

The transistor 150 may be formed on the basis of any appropriate process technique, that is, after forming the material 120, the spacer 107A may be removed in combination with the cap material 114 (FIG. 1*f*) and the drain and source regions 153 in combination with the spacer structure 151 may be formed in accordance with the overall device requirements. Next, the metal silicide regions 154 and 116 may be formed on the basis of well-established process techniques. In some illustrative embodiments, the gate electrode structure 115 may represent the final gate electrode structure when the electrical performance is considered appropriate. That is, if the material 113 in combination with the material 112 and the dielectric material may provide a desired work function and thus threshold of the transistor 150, no further modification may be required in the gate electrode structure 115.

Figure 1H:
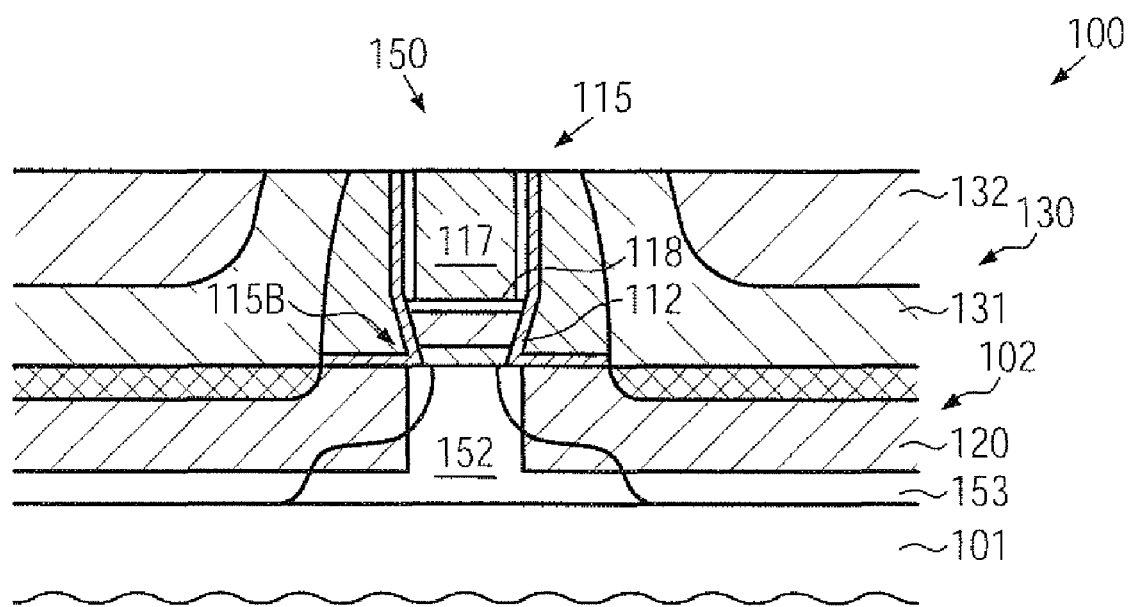

FIG. 1*h* schematically illustrates the semiconductor device 100 wherein the gate electrode structure 115 comprising the undercut portion 115B may comprise a metal-containing electrode material 117, possibly in combination with an additional metal species 118 in order to appropriately adjust the work function of the gate electrode structure 115. Moreover, in the manufacturing stage shown, an interlayer dielectric material 130 may be provided, for instance in the form of a first dielectric material 131 and a second dielectric material 132, such as a silicon nitride material, a nitrogen-containing silicon carbide material in combination with a silicon dioxide-based material.

The semiconductor device 100 may be formed on the basis of the device as shown in FIG. 1*g* by depositing the interlayer dielectric material 130 based on any appropriate deposition technique followed by the removal of any excess material in order to expose the gate electrode structure 115. Thereafter, the metal silicide material, if provided, may be removed and the semiconductor material 113 (FIG. 1*g*) may be removed on the basis of any appropriate etch technique. Thereafter, the layer 118 may be deposited, if required, followed by the deposition of the material 117. It should be appreciated that additional materials may be contained in the gate electrode structure 115, if, for instance, other work function adjusting metals may have to be provided in a different type of transistor, such as N-channel transistors and the like.

Consequently, on the basis of the undercut portion 115B, a superior strain-inducing mechanism may be provided in combination with superior performance of gate electrodes, at least in view of providing a high-k dielectric material, which may result in a desired degree of channel controllability without contributing to increased leakage currents.

Figure 2A:
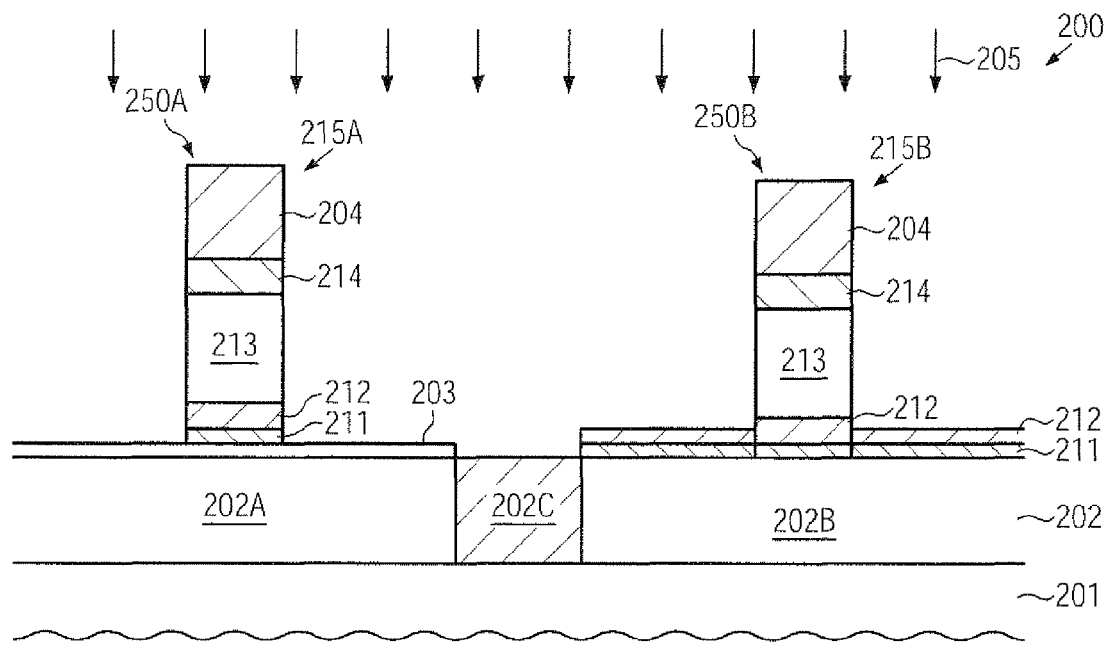
FIGS. 2a-2b schematically illustrate cross-sectional views of a semiconductor device during a manufacturing phase for patterning gate electrode structures of a P-channel transistor and an N-channel transistor with an undercut bottom portion formed selectively in the P-channel transistor, according to still further illustrative embodiments.
Figure 2B:
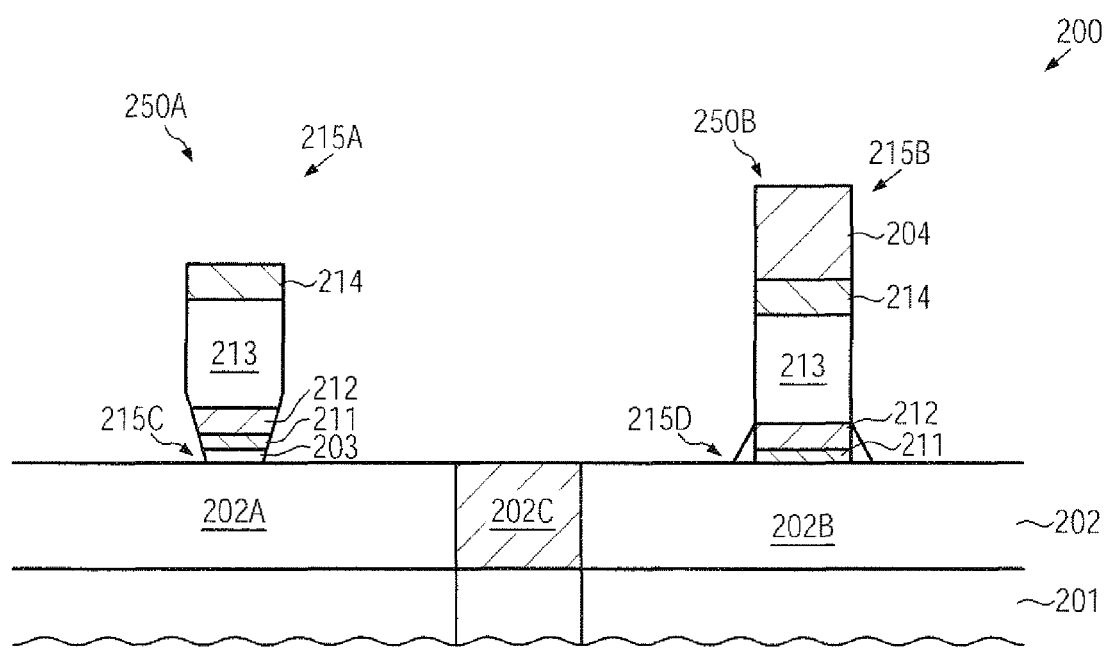

With reference to FIGS. 2*a*-2*b*, further illustrative embodiments will be described in which the process sequence illustrated with reference to the device 100 may be applied to transistors of different conductivity type.

FIG. 2*a* schematically illustrates a cross-sectional view of the semiconductor device 200 comprising a substrate 201 and a silicon-based semiconductor layer 202. Furthermore, an isolation structure 202C may be formed in the semiconductor layer 202 in order to laterally delineate a first active region 202A and a second active region 202B. Moreover, a first gate electrode structure 215A of the first transistor 250A, such as a P-channel transistor, may be formed above the active region 202A. Similarly, a second gate electrode structure 215B of a second transistor 250B, such as an N-channel transistor, may be formed above the second active region 202B. It should be appreciated that, with respect to any characteristics of the substrate 201, the semiconductor layer 202 and the gate electrode structures 215A, 215B, similar criteria may apply as previously explained with reference to the device 100. For example, in the manufacturing stage shown, the gate electrode structures 215A, 215B may be formed during a patterning process 205, during which materials 214, 213, 212 and 211 may be patterned on the basis of a mask material 204. With respect to any characteristics of these materials, it may be referred to the device 100. As previously indicated, the patterning process 205 may result in a different etch behavior compared to conventional gate electrode structures, wherein a certain degree of asymmetry may occur between the gate electrode structures 215A, 215B. For instance, in some cases, different material compositions for the metal-containing cap layers 212 may be used for the transistors 250A, 250B, for instance in view of adjusting an appropriate work function and the like. In other cases, the layers 211 and 212 may have substantially the same composition for both gate electrode structures 215A, 215B, while an additional threshold adjusting semiconductor alloy 203 may be provided on the active region 202A in order to provide a desired band gap offset of a channel region to be formed in the active region 202A. For example, the semiconductor material 203 may be provided in the form of a silicon/germanium alloy with a specified germanium concentration and with a specified thickness. Thus, due to a certain degree of asymmetry in the configuration of the gate electrode structures 215A, 215B, a different etch behavior, at least at a final phase, may result in a different configuration of a lower portion of the gate electrode structures 215A, 215B.

FIG. 2*b* schematically illustrates the semiconductor device 200 after completing the patterning process 205, which may also include any post etch cleaning recipes and the like, as is also previously explained. Consequently, the gate electrode structure 215A may comprise an undercut portion 215C, while the gate electrode structure 215B may have substantially the same gate length along the entire gate height or may have an increased length with respect to the materials 212 and 211, as indicated by 215D. Thereafter, the further processing may be continued by depositing an appropriate spacer layer with a desired reduced thickness, as previously explained with reference to the device 100, and patterning the spacer layer, for instance by providing a resist mask so as to cover the transistor 250B, while exposing the transistor 250A. Consequently, respective spacer elements may be formed on sidewalls of the gate electrode structure 215A that may conformally adhere to the undercut portion 215C, as is also previously described with reference to the semiconductor device 100. On the other hand, the transistor 250B may remain covered by the spacer layer which may then act as a growth mask after forming corresponding cavities and exposing the device 200 to a selective epitaxial growth ambient. Hence, due to the undercut portion 215C, similar advantages may be accomplished with respect to the strain engineering of the transistor 250A. Thereafter, the further processing may be continued by removing the spacer elements and the remaining spacer layer in combination with the cap materials 214 and forming appropriate drain and source regions in accordance with well-established process techniques. Consequently, also in this case, superior strain conditions may be obtained in the transistor 250A, wherein enhanced electrical performance of the gate electrode structures 215A, 215B may also be accomplished, for instance due to providing the dielectric materials 211 with a high-k dielectric material. Furthermore, as previously discussed with reference to the device 100, if required, the material 213 may be replaced by an appropriate metal-containing electrode material so as to further enhance the electrical performance of the gate electrode structures 215A, 215B.

As a result, the present disclosure provides techniques and semiconductor devices in which a tapered or undercut configuration of a lower portion of a gate electrode structure may be used for providing superior strain conditions in sophisticated transistor elements, wherein the undercut configuration may be obtained on the basis of a sophisticated gate layer stack including a high-k dielectric material in combination with a metal-containing cap material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate electrode structure above a semiconductor region, said gate electrode structure comprising a high-k dielectric material, a metal-containing cap layer formed above said high-k dielectric material, a semiconductor material formed above said metal-containing cap layer and a dielectric cap material formed above said semiconductor material, said gate electrode structure having a tapered bottom portion with a reduced length;
   forming a spacer on sidewalls of said gate electrode structure, said spacer having a first spacer portion adhering to said tapered bottom portion and having a second spacer portion adhering to a substantially non-tapered portion of said gate electrode structure;
   forming an embedded strain-inducing semiconductor material in said semiconductor region with a lateral offset determined by said first spacer portion; and
   forming drain and source regions of a transistor in at least a portion of said strain-inducing semiconductor alloy.

2. The method of claim 1, wherein said spacer is formed by depositing a spacer layer having a thickness of approximately 10 nm or less.

3. The method of claim 2, wherein said spacer layer is deposited with a thickness of approximately 8 nm or less.

4. The method of claim 1, wherein forming said gate electrode structure further comprises using a portion of said semiconductor material as an electrode material.

5. The method of claim 1, wherein said strain-inducing semiconductor alloy is formed so as to induce a compressive strain in a channel region of said transistor.

6. The method of claim 1, further comprising forming an threshold adjusting semiconductor material on said semiconductor region prior to forming said gate electrode structure.

7. The method of claim 6, wherein said threshold adjusting semiconductor material comprises silicon and germanium.

8. A method, comprising:
   forming a gate electrode structure above a semiconductor region, said gate electrode structure comprising a high-k dielectric material, a metal-containing cap layer formed above said high-k dielectric material, a semiconductor material formed above said metal-containing cap layer and a dielectric cap material formed above said semiconductor material, said gate electrode structure having a tapered bottom portion with a reduced length;
   forming a spacer on sidewalls of said gate electrode structure, said spacer having a first spacer portion adhering to said tapered bottom portion and having a second spacer portion adhering to a substantially non-tapered portion of said gate electrode structure;
   forming an embedded strain-inducing semiconductor material in said semiconductor region with a lateral offset determined by said first spacer portion;
   forming drain and source regions of a transistor in at least a portion of said strain-inducing semiconductor alloy; and
   replacing said semiconductor material by a metal-containing electrode material after forming said drain and source regions and providing a metal silicide therein.

9. The method of claim 8, wherein forming said spacer comprises depositing a spacer layer having a thickness of approximately 10 nm or less.

10. A method, comprising:
    forming a first gate electrode structure above a first semiconductor region, said first gate electrode structure comprising a first high-k dielectric material, a first metal-containing cap layer formed above said first high-k dielectric material, a first semiconductor material formed above said first metal-containing cap layer, and a first dielectric cap material formed above said first semiconductor material, wherein said first gate electrode structure is formed so as to have tapered bottom portion with a reduced length thereof;
    forming a second gate electrode structure above a second semiconductor region, wherein said second gate electrode structure is formed so as to avoid a reduction in length in a bottom portion thereof;
    forming a spacer on sidewalls of said first gate electrode structure, said spacer having a first spacer portion adhering to said tapered bottom portion and having a second spacer portion adhering to a substantially non-tapered portion of said first gate electrode structure;
    forming an embedded strain-inducing semiconductor material in said first semiconductor region with a lateral offset determined by said first spacer portion; and
    forming drain and source regions of a first transistor in at least a portion of said strain-inducing semiconductor alloy.

11. The method of claim 10, further comprising forming said strain-inducing semiconductor alloy selectively in said first semiconductor region while masking said second semiconductor region.

12. The method of claim 10, wherein forming said second gate electrode structure comprises forming a second high-k dielectric material above said second semiconductor region, forming a second metal-containing cap layer above said second high-k dielectric material, forming a second semiconductor material above said second metal-containing cap layer, and forming a second dielectric cap material above said second semiconductor material.

13. The method of claim 12, further comprising replacing at least one of said first semiconductor material of said first gate electrode structure and said second semiconductor material of said second gate electrode structure by a metal-containing electrode material.

14. The method of claim 10, wherein forming said spacer comprises depositing a spacer layer having a thickness of approximately 5 nm or less.

15. The method of claim 10, further comprising forming a threshold adjusting semiconductor material selectively on said first semiconductor region prior to forming said first and second gate electrode structures.

* * * * *